United States Patent [19]

Dvir

[11] Patent Number: 5,621,771
[45] Date of Patent: Apr. 15, 1997

[54] OPEN LOOP SWITCHING FREQUENCY SOURCE UTILIZING CLOSED LOOP STABILIZATION

[75] Inventor: Moshe Dvir, Kiryat Bialik, Israel

[73] Assignee: State of Israel Rafael-Armament Development Authority

[21] Appl. No.: 208,327

[22] Filed: Mar. 10, 1994

[30] Foreign Application Priority Data

Mar. 28, 1993 [IL] Israel .................................... 105180

[51] Int. Cl.⁶ .................. H04L 7/00; H03L 7/00; H04B 1/40; H04B 1/18
[52] U.S. Cl. .................. 375/354; 375/371; 327/105; 331/1 R; 331/34; 455/76; 455/161.1; 455/165.1; 455/260
[58] Field of Search .................. 375/106, 118, 375/119, 120, 354, 355, 371, 373, 375, 376; 307/269; 328/63, 72; 331/1 R, 34; 364/721; 327/105–107; 453/76, 161.1, 165.1, 183.1, 183.2, 260

[56] References Cited

U.S. PATENT DOCUMENTS

| | | | |
|---|---|---|---|
| 3,902,013 | 8/1975 | Charbonnier | 375/65 |
| 4,066,964 | 1/1978 | Costanza | 375/373 |
| 4,171,513 | 10/1979 | Otey | 375/354 |
| 4,281,412 | 7/1981 | Wissel | 375/120 |
| 4,355,404 | 10/1982 | Uzunoglu | 375/97 |
| 4,484,356 | 11/1984 | Geesen | 455/165.1 |
| 4,521,915 | 6/1985 | Baker | 455/165.1 |
| 4,525,685 | 6/1986 | Hesselberth | 375/107 |
| 4,669,091 | 5/1987 | Nossen | 455/65 |
| 4,688,261 | 8/1987 | Killoway | 455/76 |
| 4,870,699 | 9/1989 | Garner | 455/76 |
| 5,016,202 | 5/1991 | Seibel | 331/4 |
| 5,056,118 | 10/1991 | Sun | 375/120 |
| 5,341,404 | 8/1994 | Sevenhans | 375/106 |
| 5,373,257 | 12/1994 | Shimoda | 331/8 |
| 5,377,232 | 12/1994 | Davidov | 375/106 |
| 5,377,233 | 12/1994 | Girmay | 375/106 |
| 5,412,687 | 5/1995 | Sutton | 375/202 |
| 5,414,741 | 5/1995 | Johnson | 375/376 |

Primary Examiner—Curtis Kuntz
Assistant Examiner—Vijay Shankar
Attorney, Agent, or Firm—Mark M. Friedman

[57] ABSTRACT

A frequency source for sequentially generating several output signals of different frequencies, which includes a permanent frequency table, a digitally stored frequency table and a single stabilization circuit for updating the digitally stored frequency table using the permanent frequency table and the output frequency. The source further includes the ability to convert the digitally stored frequency to the generated output frequency; and a clock for synchronizing the updating of the digitally stored frequency table. In certain embodiments the source further includes a sampler for sampling the output signal and a feedback mechanism for feeding back the output signal to the stabilization circuit.

15 Claims, 1 Drawing Sheet

OPEN LOOP SWITCHING FREQUENCY SOURCE UTILIZING CLOSED LOOP STABILIZATION

FIELD AND BACKGROUND OF THE INVENTION

The present invention relates to frequency source devices, particularly useful for effecting radio frequency broadcasting through the fast sweep over a series of pre-determined frequencies.

In various applications, especially in certain communications systems, there is need for stable frequency sources which allow for very fast switching between frequencies.

For example, various radio frequency broadcast systems are available which are designed to make it difficult or impossible to electronically jam the broadcast. One way of accomplishing this is to broadcast sequentially over a number, preferably a large number, of frequencies, switching rapidly from one frequency to the next. In such a system, signals are typically broadcasted at one frequency for only a short period of time, before switching to a different frequency.

If the switching speed is sufficiently great, comprehensible transmitted information, such as human speech, may be reconstructed using partial groups of a relatively large number of reception frequencies. In this way, if one or more frequencies are being jammed, the information can still be received using the frequencies which are not being jammed without loss of information.

Two basic techniques for generating ultra fast frequency switching are in current use. One method involves the use of a Direct Digital Synthesizer (DDS), while another involves the use of two parallel frequency generators operating in tandem.

A DDS synthesizes frequencies directly by repetitive arithmetic manipulations of frequency in a series of modules. Frequency synthesizers combine the advantages of tunable oscillators, which are not usually highly stable, with those of frequency standards, which, though very stable, are not tunable.

The typical DDS suffers from at least two serious disadvantages. First, the maximum output frequency of a typical DDS is approximately 10 to 15 MHz. In order to achieve higher frequencies a highly complex radio frequency (RF) processing system is required. Second, the noise level of the output frequency of a DDS is relatively high.

Use of two frequency generators in tandem, such that when one generator is producing signals the other is stabilizing so as to be ready to produce the next frequency upon switching, yields very good frequency generation performance. However, this performance is achieved at a very high cost, both in terms of the required hardware and in terms of the physical volume occupied by the dual system. In certain applications, either the cost or the volume, or both, may be critical factors.

There is thus a widely recognized need for, and it would be highly advantageous to have, a small and inexpensive frequency source which will reliably and very quickly sweep over a series of frequencies.

SUMMARY OF THE INVENTION

According to the present invention there is provided a frequency source for sequentially generating a plurality of output signals of different frequencies, comprising: (a) a permanent frequency table; (b) a digitally stored frequency table; (c) a single stabilization circuit for updating the digitally stored frequency table using the permanent frequency table and the output frequency; (d) means for converting the digitally stored frequency to the generated output frequency; and (e) timing means for synchronizing the updating of the digitally stored frequency table.

According to further features in preferred embodiments of the invention described below, the frequency source further includes: (e) means for sampling the output signal; and (f) means for feeding back the sampled output signal to the stabilization circuit.

According to still further features in the described preferred embodiments, the means for converting the digitally stored frequency to the generated output frequency includes a digital-to-analog converter and a voltage controlled oscillator.

According to yet further features of the described preferred embodiment, the means for feeding back the generated output frequency to the stabilization circuit includes a frequency divider and the timing means further synchronizes the means for converting the digitally stored frequency to the generated output frequency.

The present invention successfully addresses the shortcomings of the presently known configurations by providing a frequency source which is small and inexpensive, yet which reliably produces a series of signals of different frequencies at very fast switching rates.

The device according to the present invention takes advantage of the fact that when very wide band modulation is desired, the main requirement of the source is frequency stabilization rather than low phase noise. Hence, one can take advantage of the processing potential of the digital hardware.

The present invention discloses a novel frequency source which is able to produce very high frequency switching rates without the expense and physical volume of a dual frequency generator.

More specifically, the frequency generator of the present invention utilizes an open loop to generate a desired frequency. Concurrently, a closed feedback loop is used to update and stabilize a digital frequency table used to generate the frequencies. In this way, the need for expensive and volume-consuming dual system frequency generator is obviated and very fast and reliable sweeping over a series of frequencies is effected.

BRIEF DESCRIPTION OF THE DRAWINGS

The invention is herein described, by way of example only, with reference to the accompanying drawing, wherein the single FIGURE is a schematic block of a device according to the present invention.

DESCRIPTION OF THE PREFERRED EMBODIMENTS

Figure 1:
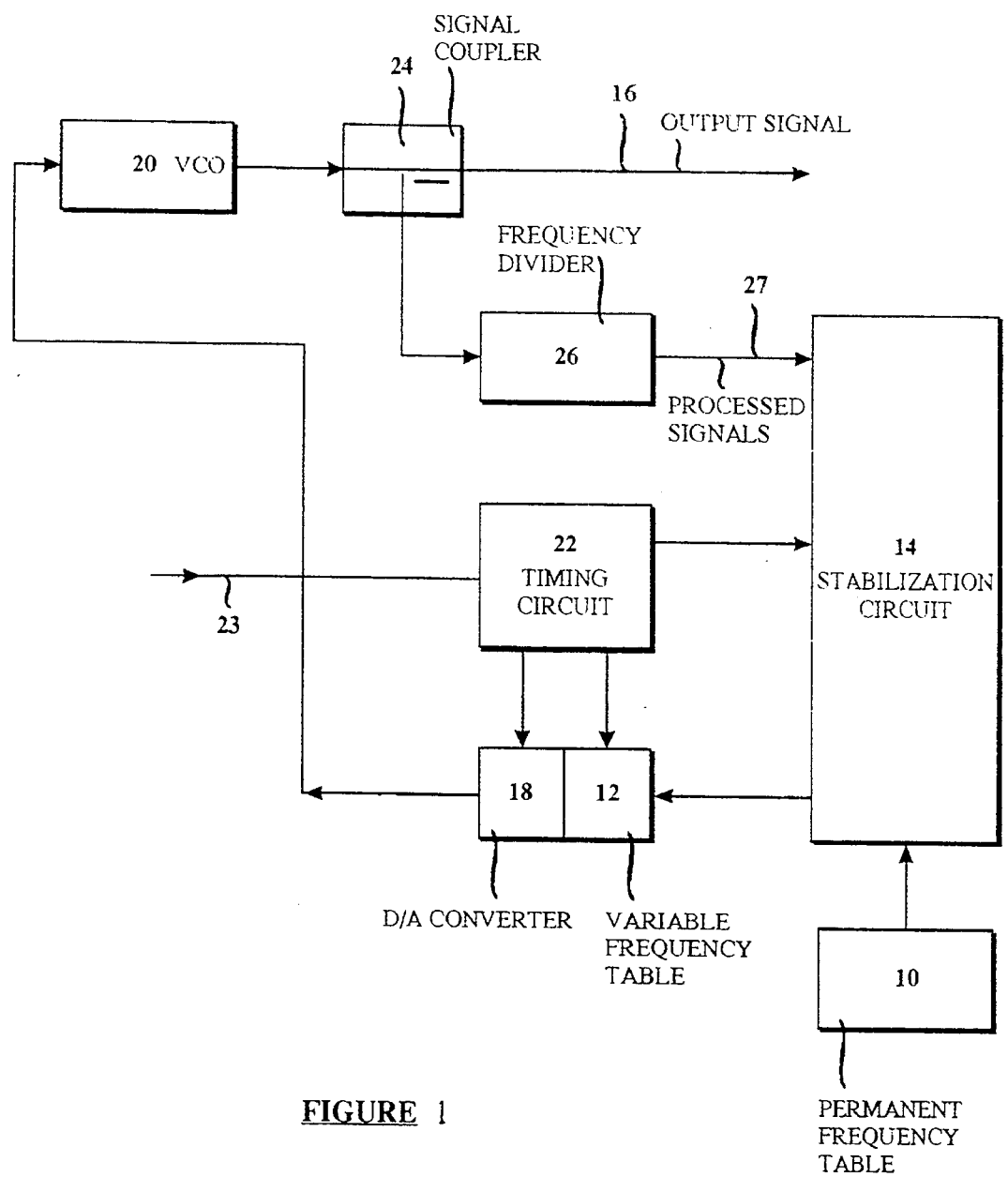

The present invention is of a small and inexpensive frequency source which can be used to rapidly sweep a series of desired frequencies.

The principles and operation of a frequency source according to the present invention may be better understood with reference to the drawings and the accompanying description.

Referring now to the drawing, the FIGURE schematically illustrates one example of a device according to the present invention which includes a permanent frequency table 10, for example, a list of desired frequencies permanently etched on a suitable medium. A device according to the present invention further includes a digitally stored and impermanent frequency table 12, stored, for example, in a suitable writable random access memory (RAM) device.

Ideally, the frequencies included in permanent frequency table 10 should be identical to those produced by the device. However, due to various disturbances, such as, for example, variations in temperature which can affect various components, especially the voltage controlled oscillator 20, described below, deviations occur between the desired frequencies, i.e., those stored on permanent frequency table 10, and the frequencies generated by the device.

To correct such deviations, a device according to the present invention further includes a stabilization circuit 14. Unlike certain existing frequency generators which include two or more generator systems, as described above, a frequency generator device according to the present invention features a single stabilization circuit which serves to stabilize all the frequencies which undergo stabilization.

A device according to the present invention further includes means for using a frequency stored in digitally stored frequency table 12 to generate an output signal 16. While any suitable means may be used, the means for generating output signal 16 preferably includes a digital-to-analog converter 18 which produces a suitable voltage which is related to the frequency stored in digitally stored frequency table 12 which is being addressed at any given moment. Preferably, the means for generating output signal 16 further includes a voltage controlled oscillator (VCO) 20 which uses the voltage signals produced by digital-to-analog convertor 18 to produce a signal having the desired output frequency.

A frequency generator according to the present invention further includes timing means, typically a suitable timing circuit 22, for synchronizing various processes, primarily the updating of digitally stored frequency table 12. Timing circuit 22 may rely on a pulsed synchronization signal 23 or similar signal. Timing circuit 22 preferably also synchronizes digital-to-analog convertor 18 and other components of the systems described below.

Preferably, a device according to the present invention further includes a signal coupler 24 which provides the stabilization loop with a sample of the output signal for frequency measurement purposes. The measurement is used by stabilization circuit 14 to accurately update digitally-stored frequency table 12. Preferably, the signal sampled by signal coupler 24 is first processed by a suitable frequency divider 26 so as to produce processed signals 27 which are in a range which can be readily accommodated by stabilization circuit 14.

In operation, a device according to the present invention operates as follows. Desired frequencies, permanently stored in permanent frequency table 10, are compared with corresponding frequencies produced by the device and adjustments are accordingly made to digitally-stored frequency table 12. Frequencies contained in digitally-stored frequency table 12 are used to generate output signals 16, typically through use of digital-to-analog convertor 18 and voltage controlled oscillator 20. Output signal 16 is sampled and fed back to stabilization circuit 14, preferably, after being processed by frequency divider 26. Timing circuit 22 serves to synchronize the various operations.

Using a device according to the present invention, output frequencies are produced by voltage controlled oscillator 20 through what is essentially an open loop, which is generally much faster than closed loop configurations which require significant time for the stabilization of the generated closed loop.

The generated output signal 16 is sampled and fed back to stabilization circuit 14 which measures the deviation between the nominal and the actual frequencies, which deviations may be produced by a number of effects, mainly changes in VCO 20, due to changes in temperatures, and corrects, or updates, the addresses in digitally-stored frequency table 12. The updating takes place in parallel with, rather than in series with, the generation of frequencies by voltage controlled oscillator 20 and can therefore be carried out at a relatively low rates.

As a result of the processing scheme according to the present invention, there is essentially no lower limit on the switching times between frequencies which is imposed by the requirement for stabilizing the output frequency. The only limitations on the switching speed of a device according to the present invention are imposed by the inherent speeds of the various components themselves, which can be as low as tens of nanoseconds.

While the invention has been described with respect to a single preferred embodiment, it will be appreciated that many variations, modifications and other applications of the invention may be made.

What is claimed is:

1. A frequency source for generating output signals having a sequence of discrete frequencies, comprising:

(a) a permanent frequency table having a plurality of permanent frequency entries;

(b) a variable frequency table having a plurality of variable frequency entries;

(c) open loop signal generator means for generating the output signal from said variable frequency table, wherein each of the frequencies in the sequence is determined by any one of said plurality of variable frequency entries:

(d) a closed loop stabilization circuit for comparing any frequency of the output signal with the frequency of the corresponding entry in said permanent frequency table and updating said variable frequency table accordingly, the comparing and the updating occurring simultaneously with the generation of the output signal, said closed loop stabilization circuit coupled to said permanent frequency table and said variable frequency table; and (e) timing means for synchronizing the updating of said variable frequency table, said timing means coupled to said closed loop stabilization circuit.

2. A frequency source as in claim 1, further comprising:

(f) coupling means for feeding back the output signal to said closed loop stabilization circuit.

3. A frequency source as in claim 1, wherein said open loop signal generator means includes a digital-to-analog converter.

4. A frequency source as in claim 2, wherein said open loop signal generator means includes a digital-to-analog converter.

5. A frequency source as in claim 1, wherein said open loop signal generator means includes a voltage controlled oscillator.

6. A frequency source as in claim 2, wherein said open loop signal generator means includes a voltage controlled oscillator.

7. A frequency source as in claim 3, wherein said open loop signal generator means includes a voltage controlled oscillator.

8. A frequency source as in claim 2, wherein said coupling means includes a frequency divider.

9. A frequency source as in claim 3, wherein said coupling means includes a frequency divider.

10. A frequency source as in claim 5, wherein said coupling means includes a frequency divider.

11. A frequency source as in claim 1, wherein said timing means synchronizes said open loop signal generator means.

12. A frequency source as in claim 2, wherein said timing means synchronizes said open loop signal generator means.

13. A frequency source as in claim 3, wherein said timing means synchronizes said open loop signal generator means.

14. A frequency source as in claim 5, wherein said timing means synchronizes said open loop signal generator means.

15. A frequency source as in claim 8, wherein said timing means synchronizes said open loop signal generator means.

* * * * *